United States Patent
Zhang

(10) Patent No.: US 8,253,600 B2
(45) Date of Patent: Aug. 28, 2012

(54) KEYBOARD WITH MULTI-ANGLE SUPPORT

(75) Inventor: Shuai Zhang, Shenzhen (CN)

(73) Assignees: Fu Tai Hua Industry (Shenzhen) Co., Ltd., ShenZhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 264 days.

(21) Appl. No.: 12/826,977

(22) Filed: Jun. 30, 2010

(65) Prior Publication Data

US 2011/0215953 A1   Sep. 8, 2011

(30) Foreign Application Priority Data

Mar. 5, 2010   (CN) .......................... 2010 1 0118633

(51) Int. Cl.
*H03M 11/00*   (2006.01)
(52) U.S. Cl. ..................................... 341/22; 361/679.11
(58) Field of Classification Search .............. 341/20, 341/22; 361/608–611, 615–617, 679.01–679.2, 361/679.4–679.44, 679.55–679.6
See application file for complete search history.

(56) References Cited

U.S. PATENT DOCUMENTS

| | | | | |
|---|---|---|---|---|
| 5,629,832 A | * | 5/1997 | Sellers | 361/679.55 |
| 6,612,668 B2 | * | 9/2003 | Doan | 361/679.12 |
| 6,670,948 B2 | * | 12/2003 | Zarek | 400/472 |
| 2008/0310088 A1 | * | 12/2008 | Chen | 361/680 |

* cited by examiner

*Primary Examiner* — Khanh V Nguyen
(74) *Attorney, Agent, or Firm* — Altis Law Group, Inc.

(57) ABSTRACT

A keyboard includes housing and two support members. The housing defines two receiving spaces each including a bottom defining a perforation. The two support members are received in the receiving spaces. Each support member includes an adjusting wheel and a support. The adjusting wheel is rotatably received in the receiving space and defines a spiral groove. The spiral groove includes spiral lateral surface. The support is received in the receiving spaces and aligned with the perforation, and includes a pin received in the spiral groove. When the adjusting wheels are rotated, the pins are urged by the spiral lateral surface to move, changing an inclination angle between the base and a support surface supporting the base.

10 Claims, 5 Drawing Sheets

KEYBOARD WITH MULTI-ANGLE SUPPORT

BACKGROUND

1. Technical Field

The present disclosure relates to keyboards and, particularly, to a keyboard with a multi-angle support.

2. Description of Related Art

A keyboard usually includes a pair of supports for tilting a main body at a certain angle when used. The supports are rotatably received in slots defined in the bottom of the main body. The supports usually can provide the main body with one or two orientations, which may not satisfy users' need for more orientations in certain conditions.

Therefore, what is needed is a new keyboard to overcome the described shortcoming.

DETAILED DESCRIPTION

Figure 1:
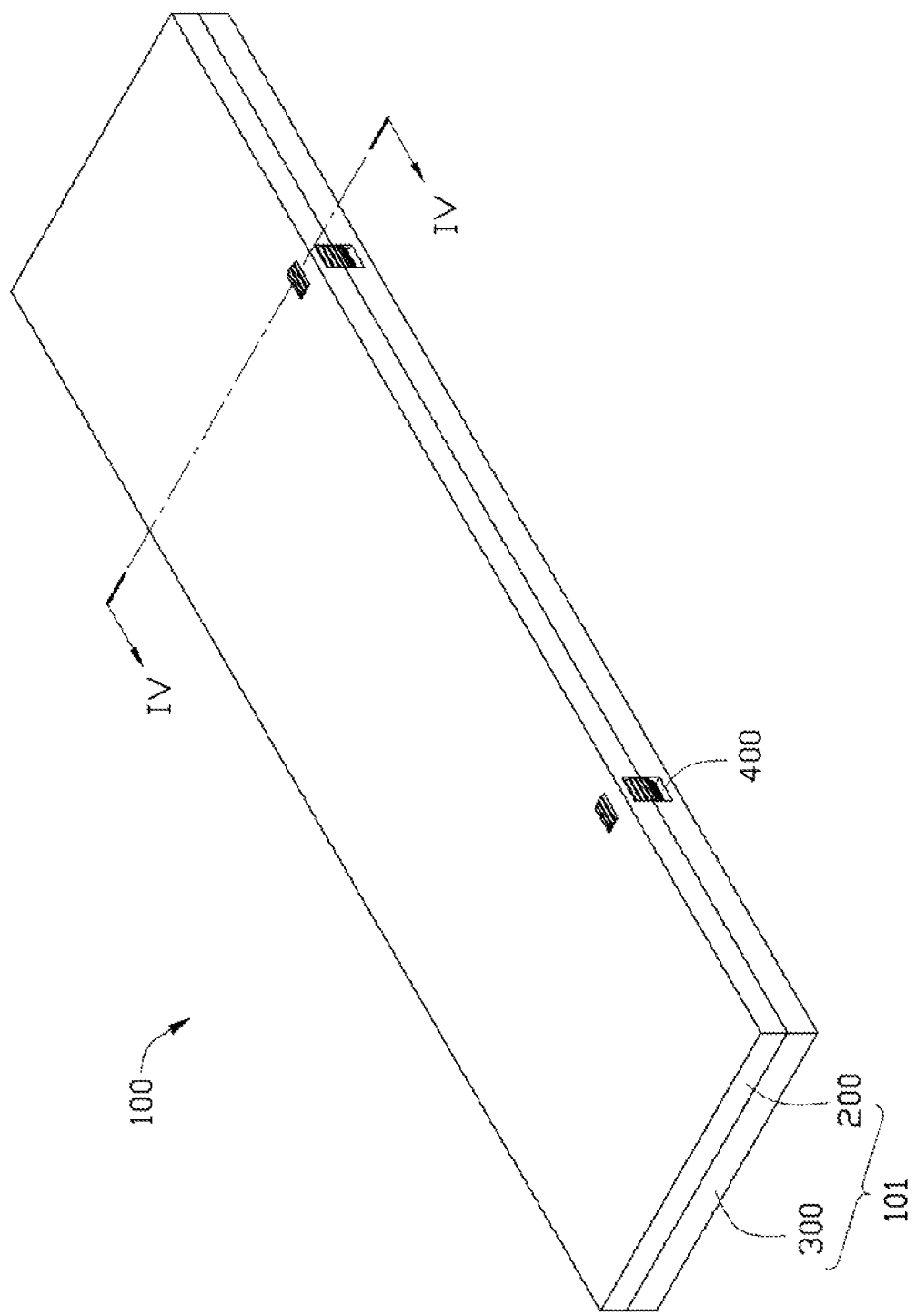
FIG. 1 is an isometric view of a keyboard in accordance with an exemplary embodiment.
Figure 2:
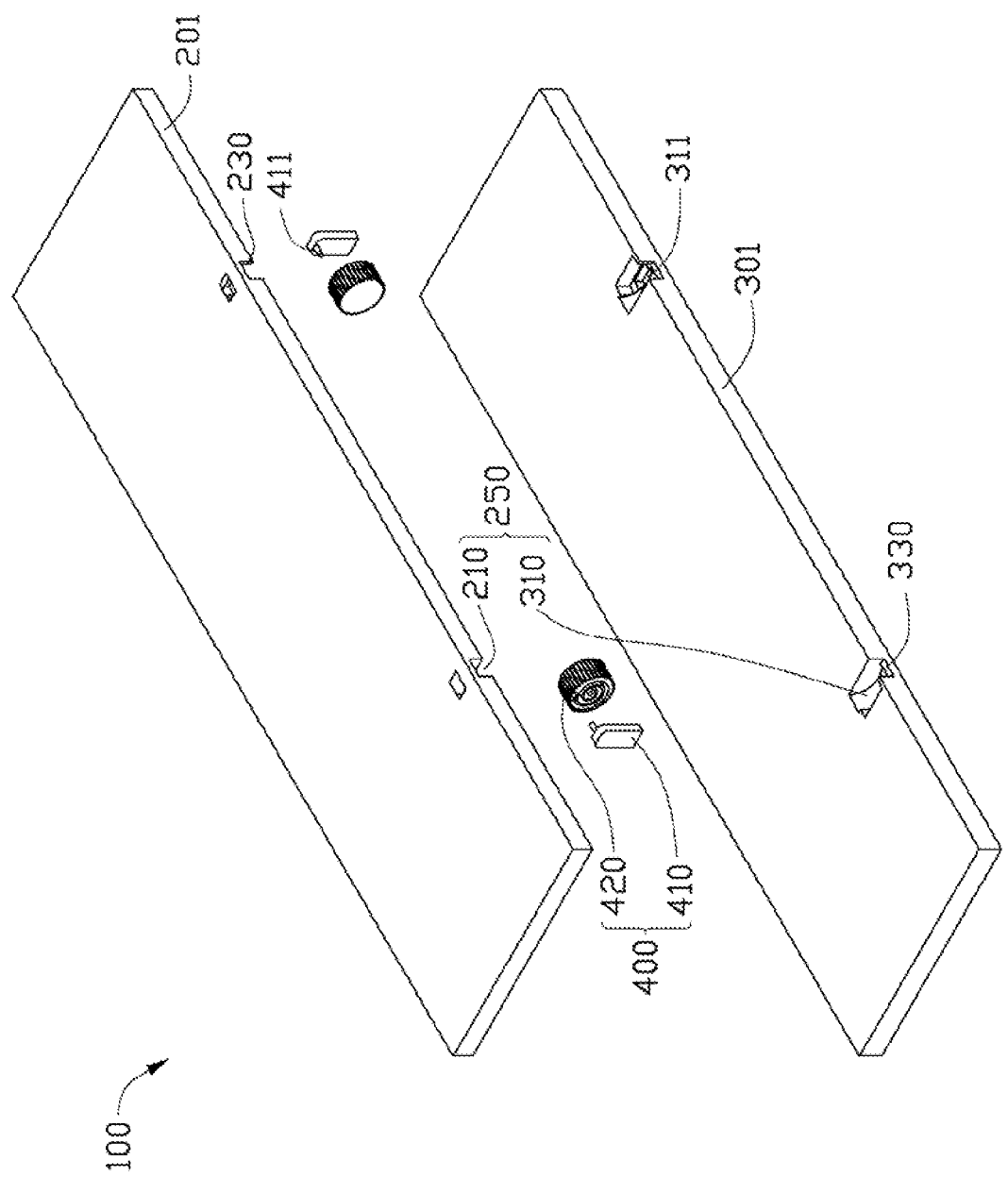
FIG. 2 is an exploded view of the keyboard of FIG. 1.

Referring to FIGS. 1 and 2, an exemplary embodiment of a keyboard 100 includes a housing 101 including a top cover 200, a base 300, and two support members 400.

The top cover 200 has a first sidewall 201. Two first openings 230 are defined in the first sidewall 201. Two receiving chambers 210 are defined in the top cover 200. Each first receiving chamber 210 is adjacent to the first sidewall 201 and communicated with a corresponding first opening 230.

The base 300 has a second sidewall 301. Two second openings 330 are defined in the second sidewall 301. Two second receiving chambers 310 is defined in the base 300. Each second receiving chamber 310 is adjacent to the second sidewall 301 and communicated with a corresponding second opening 330. Each first receiving chamber 210 cooperates with a corresponding second receiving chamber 310 to form a receiving space 250 for receiving one of the two support members 400. Each first opening 230 corresponds to a respective one of the second openings 330. Two perforations 311 are defined in a bottom of the base. Each perforation 311 is communicated with a corresponding receiving space 250.

Figure 3:
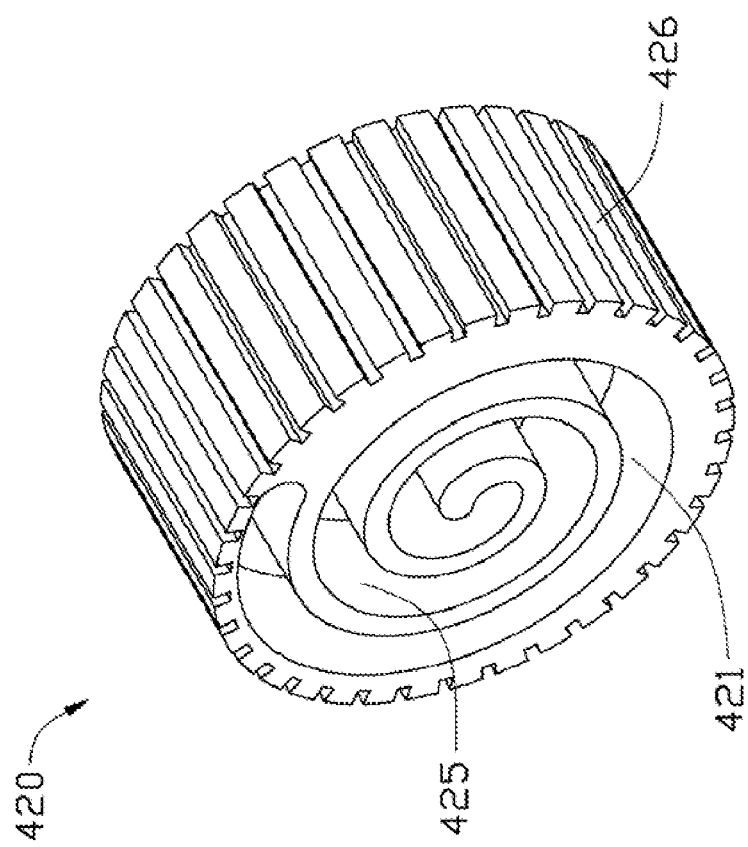
FIG. 3 is an isometric view of an adjusting wheel of the keyboard of FIG. 1.
Figure 4:
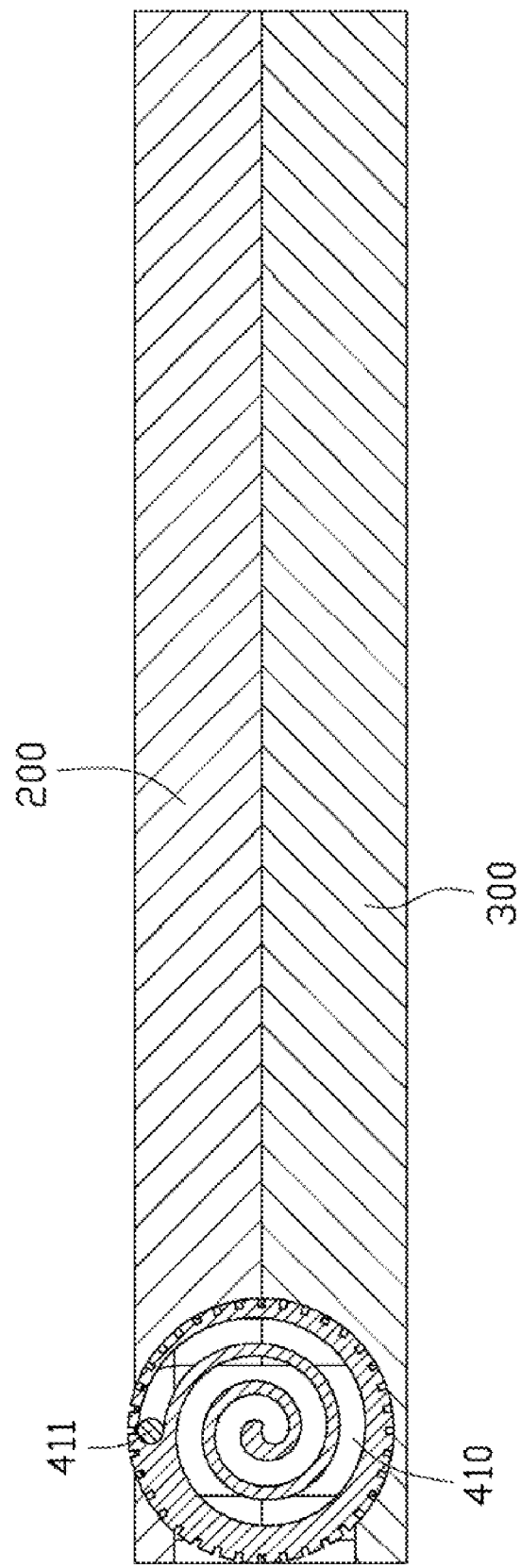
FIG. 4 is a cross-sectional view of the keyboard of FIG. 1, taken along line IV-IV of FIG. 1, showing a support in a retracted state.
Figure 5:
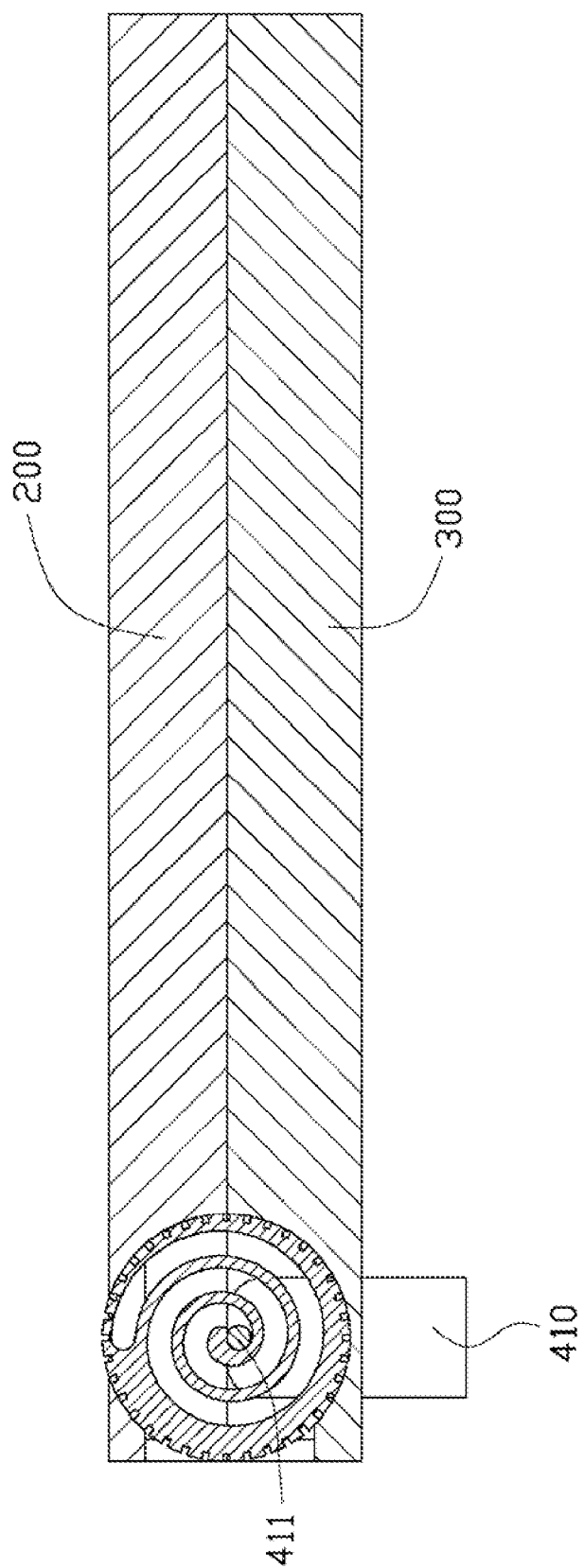
FIG. 5 is similar to FIG. 4, but showing the support in an extended state.

Referring to FIGS. 3-5, the support members 400 are configured for adjusting a tilting angle of the keyboard 100 relative to a support surface, such as a desktop. Each support member 400 includes a support 410 and an adjusting wheel 420. The support 410 is received in the receiving space 250 and aligned with the perforation 311, and can move in/out of the receiving spaces 250 through the perforation 311. A pin 411 protrudes from the support 410.

Each adjusting wheel 420 is received in the receiving space 250. Each adjusting wheel 420 is substantially cylindrical-shaped and includes a spiral groove 421 extending from one side to an opposite side. The spiral groove 421 includes a spiral lateral surface 425. The pin 411 is received in the spiral groove 421 and contacts the spiral lateral surface 425. Part of the adjusting wheel 420 is exposed out of the top cover 200 and the base via the openings 230, 330, allowing the users to rotate the adjusting wheel 420. As the adjusting wheel 420 rotates, the pin 411 is urged by the spiral surface 425 to move, changing the inclination angle between the base 300 and the desktop. In the embodiment, the outer surface of the adjusting wheel 420 defines a plurality of spaced parallel grooves 426 to provide friction when contacted by a user's fingertip when the user rotates the adjusting wheel 250.

Although the present disclosure has been specifically described on the basis of the embodiments thereof, the disclosure is not to be construed as being limited thereto. Various changes or modifications may be made to the embodiments without departing from the scope and spirit of the disclosure.

What is claimed is:

1. A keyboard comprising:
   a housing defining two receiving spaces each comprising a bottom defining a perforation; and
   two support members received in the receiving spaces, each of the support members comprising:
   an adjusting wheel rotatably received in the receiving space and defining a spiral groove, the spiral groove comprising a spiral lateral surface; and
   a support received in the receiving spaces and aligned with the perforation, the support comprising a pin received in the spiral groove;
   wherein, when the adjusting wheels are rotated, the pins are urged by the spiral lateral surface to move, changing an inclination angle between the housing and a support surface.

2. The keyboard as described in claim 1, wherein the housing comprises a top cover and a base, the top cover comprises two first receiving chambers, the base comprises two second receiving chambers which cooperate with the two first receiving chambers of the top cover to form the two receiving spaces.

3. The keyboard as described in claim 2, wherein the top cover defines two first openings and the base defines two second openings, and a part of each adjusting wheel is exposed out of the receiving space through the two first opening and the two second opening.

4. The keyboard as described in claim 3, wherein each first opening is communicated with one corresponding first receiving chamber, each second opening is communicated with one corresponding second receiving chamber.

5. The keyboard as described in claim 1, wherein the outer surface of each adjusting wheel defines a plurality of spaced parallel grooves.

6. A keyboard comprising:
   a top cover defining two first receiving chambers;
   a base defining two second receiving chambers which cooperate with the two first receiving chambers of the top cover to form two receiving spaces, two perforation being defined in the bottom of the base, each second receiving chamber being communicated with a corresponding perforation, and
   two support members received in the receiving spaces, each of the support members comprising:
   an adjusting wheel rotatably received in the receiving space and defining a spiral groove, the spiral groove comprising a spiral lateral surface; and
   a support received in the receiving space and aligned with the perforation, two support comprising a pin received in the spiral groove and contacting the spiral lateral surface;
   wherein, when the adjusting wheels are rotated, the pins are urged by the spiral lateral surface to move in the spiral groove, thereby driving the support to move relative to the receiving space through the perforation.

7. The keyboard as described in claim 6, wherein the top cover defines two first openings and the base defines two second openings, and a part of the each adjusting wheel is exposed out of the receiving space through the first opening and the second opening.

8. The keyboard as described in claim 7, wherein each first opening is communicated with one corresponding one first receiving chamber, each second opening is communicated with one corresponding on second receiving chamber.

9. The keyboard as described in claim 8, wherein the top cover has a first sidewall, the first opening is defined in the first sidewall, and the first receiving chamber is adjacent to the first sidewall; the base has a second sidewall, the second opening is defined in the second sidewall, and the second receiving chamber is adjacent to the second sidewall.

10. The keyboard as described in claim 6, wherein the outer surface of each adjusting wheel defines a plurality of space parallel grooves to provide friction.

* * * * *